United States Patent
Lin et al.

(10) Patent No.: US 9,159,577 B2
(45) Date of Patent: Oct. 13, 2015

(54) METHOD OF FORMING SUBSTRATE PATTERN

(71) Applicant: Taiwan Semiconductor Manufacturing Company Limited, Hsinchu (TW)

(72) Inventors: Chun-Yu Lin, Hsinchu (TW); Feng-Yuan Chiu, Hsinchu County (TW); Bing-Syun Yeh, Hsinchu (TW); Yi-Jie Chen, Hsinchu (TW); Ying-Chou Cheng, Hsinchu County (TW); I-Chang Shih, Hsinchu County (TW); Ru-Gun Liu, Hsinchu County (TW); Shih-Ming Chang, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 69 days.

(21) Appl. No.: 14/180,409

(22) Filed: Feb. 14, 2014

(65) Prior Publication Data

US 2015/0235857 A1     Aug. 20, 2015

(51) Int. Cl.
  *H01L 21/308* (2006.01)
  *H01L 21/306* (2006.01)
  *H01L 21/311* (2006.01)
  *H01L 21/312* (2006.01)
  *H01L 21/033* (2006.01)
  *H01L 21/3065* (2006.01)
  *G03F 1/36* (2012.01)

(52) U.S. Cl.
  CPC ........ *H01L 21/3086* (2013.01); *H01L 21/3065* (2013.01); *H01L 21/312* (2013.01); *H01L 21/31144* (2013.01); *G03F 1/36* (2013.01)

(58) Field of Classification Search
  CPC ................. H01L 21/00337; H01L 21/0338; H01L 21/31144; G03F 1/36; G03F 1/18
  See application file for complete search history.

(56) References Cited

U.S. PATENT DOCUMENTS

2007/0148968 A1 * 6/2007 Kwon et al. ............ 438/671

* cited by examiner

*Primary Examiner* — Thanhha Pham
(74) *Attorney, Agent, or Firm* — Jones Day

(57) ABSTRACT

According to an exemplary embodiment, a method of forming a substrate pattern having an isolated region and a dense region is provided. The method includes the following operations: forming a first photoresist layer over the substrate; exposing the first photoresist layer through a first mask corresponding to the isolated region; developing the first photoresist layer to form a first pattern; forming a second photoresist layer over the substrate and the first pattern; exposing the second photoresist layer through a second mask corresponding to the substrate pattern; developing the second photoresist layer to form a second pattern; and etching the first pattern and the substrate to form the substrate pattern in the isolated region and the dense region.

20 Claims, 24 Drawing Sheets

METHOD OF FORMING SUBSTRATE PATTERN

BACKGROUND

Etching process encounters unequal etching rates between dense regions and isolation regions. Therefore, balancing of the etching rates is an issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
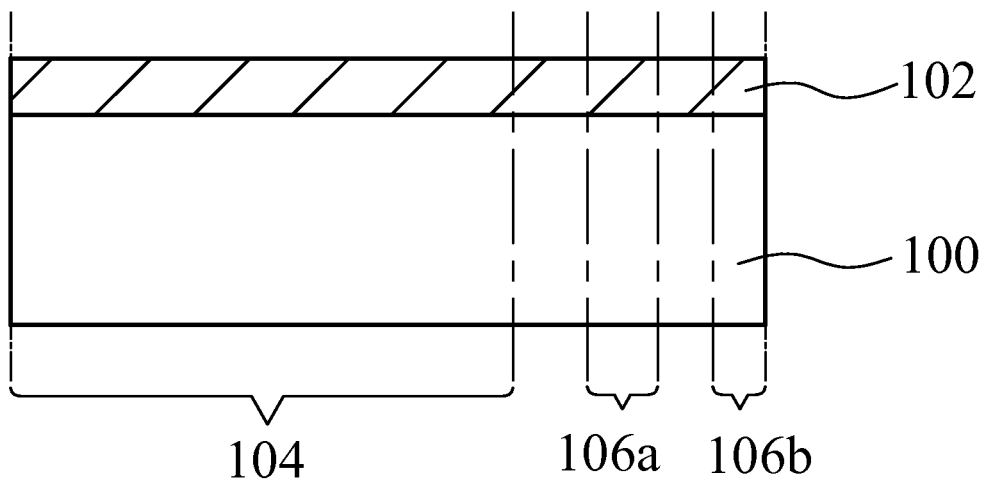
FIG. 1 is a sectional view illustrating an exemplar substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a method of forming a substrate pattern having an isolated region and a dense region by using at least two photoresists. The substrate pattern refers to the pattern to be printed in the substrate. A first photoresist is designed to slow down the etching rate of the isolation region; a second photoresist corresponds to the substrate pattern. To be more specific, the first photoresist is developed during the developing process for the second photoresist. The first photoresist covering the isolated region is consumed while etching the substrate to balance the etching rate between the isolated region and the dense region. And the first photoresist is substantially no longer present after the etching process. The method decreases etching rate bias between the isolated region and the dense region and is more capable of controlling the multiple bias effects during the etching process.

FIG. 1 is a sectional view illustrating an exemplar substrate in accordance with some embodiments. As shown in FIG. 1, a substrate 100 is provided. A first photoresist layer 102 is formed over the substrate 100. The substrate 100 includes an isolated region 104 and dense regions 106a, 106b. The first photoresist layer 102 may be formed of a first negative photoresist. The isolated region 104 and the dense regions 106a, 106b are predetermined. Additionally, thickness and stiffness of the first photoresist layer 102 may be adjusted to enhance the etching process.

Figure 2:
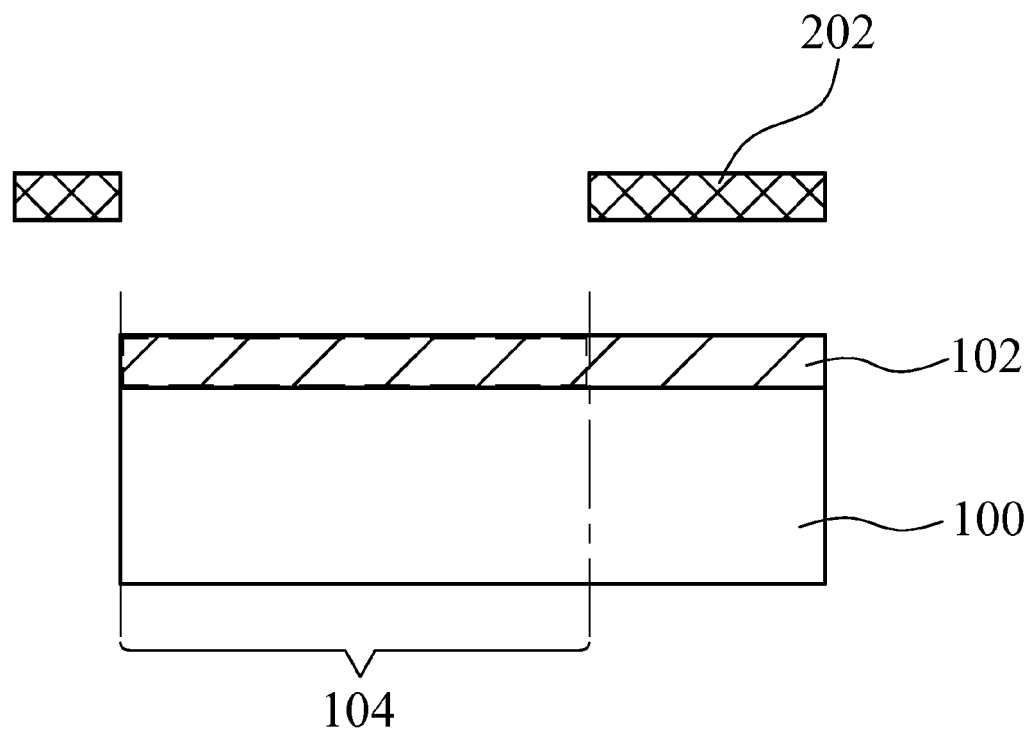
FIG. 2 is a sectional view illustrating the exemplar substrate in accordance with some embodiments.

FIG. 2 is a sectional view illustrating the exemplar substrate in accordance with some embodiments. As shown in FIG. 2, the first photoresist layer 102 is exposed through a first mask 202 corresponding to the isolated region 104.

Figure 3:
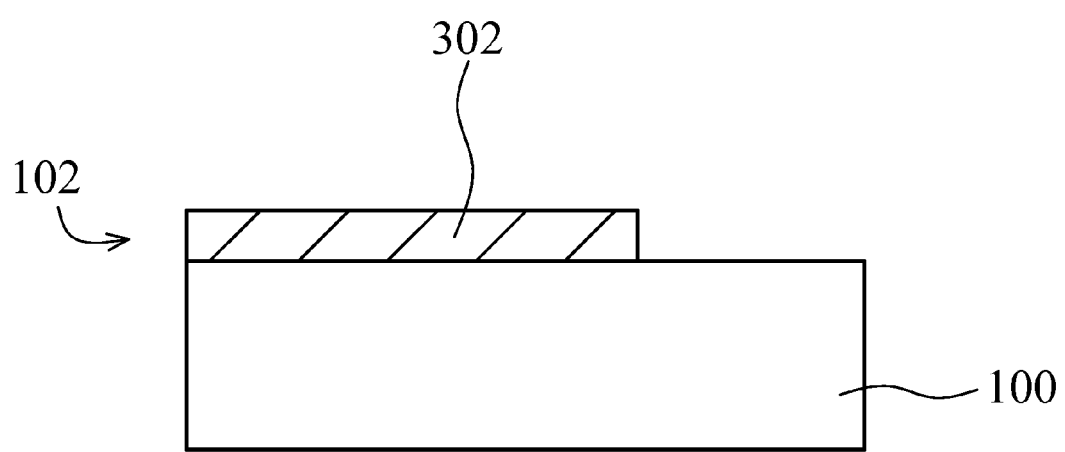
FIG. 3 is a sectional view illustrating the exemplar substrate in accordance with some embodiments.

FIG. 3 is a sectional view illustrating the exemplar substrate in accordance with some embodiments. As shown in FIG. 3, the first photoresist layer 102 is developed to form a first pattern 302.

Figure 4:
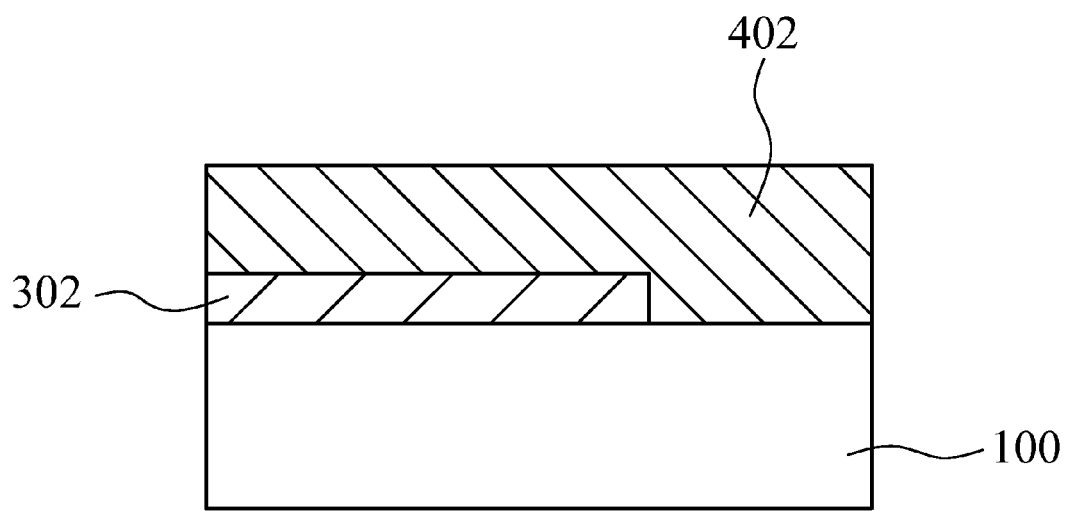
FIG. 4 is a sectional view illustrating the exemplar substrate in accordance with some embodiments.

FIG. 4 is a sectional view illustrating the exemplar substrate in accordance with some embodiments. As shown in FIG. 4, a second photoresist layer 402 is formed over the substrate 100 and the first pattern 302. The second photoresist layer 402 may be formed of a second negative photoresist.

Figure 5:
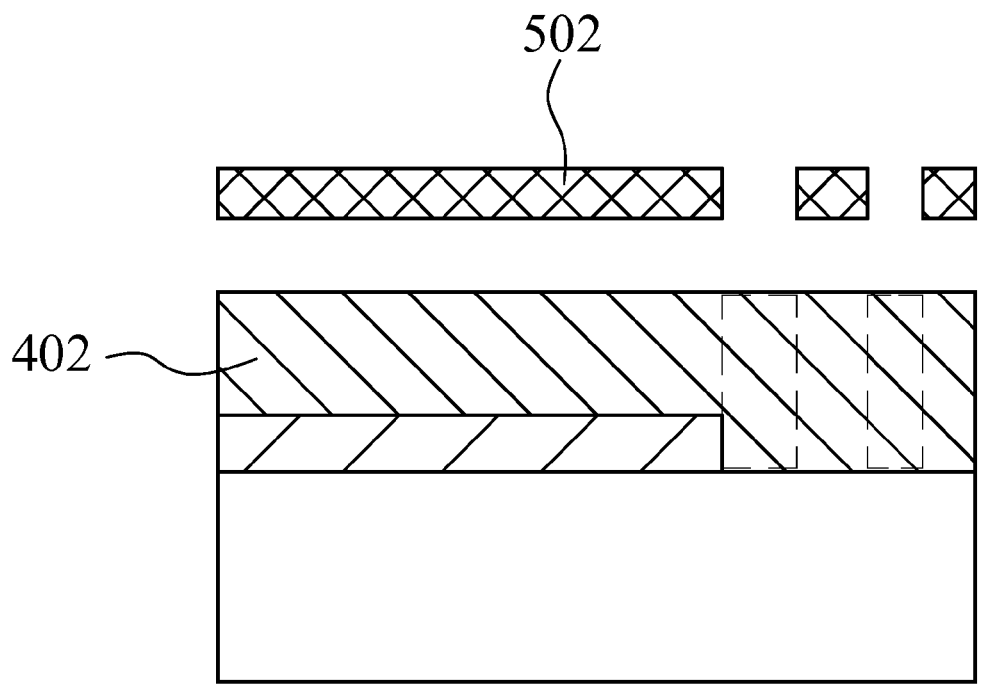
FIG. 5 is a sectional view illustrating the exemplar substrate in accordance with some embodiments.

FIG. 5 is a sectional view illustrating the exemplar substrate in accordance with some embodiments. As shown in FIG. 5, the second photoresist layer 402 is exposed through a second mask 502 corresponding to the substrate pattern (not shown).

Figure 6:
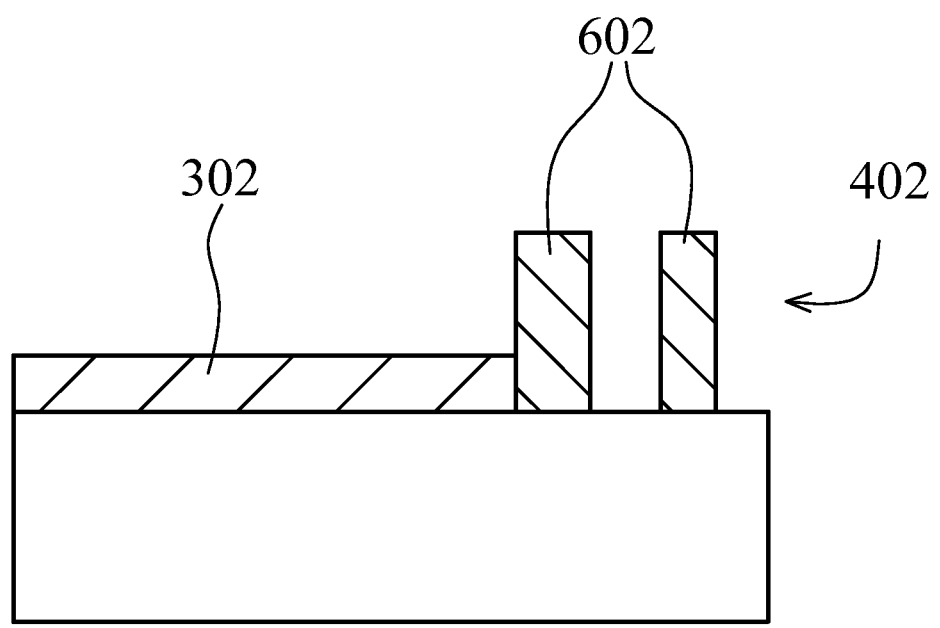
FIG. 6 is a sectional view illustrating the exemplar substrate in accordance with some embodiments.

FIG. 6 is a sectional view illustrating the exemplar substrate in accordance with some embodiments. As shown in FIG. 6, the second photoresist layer 402 is developed to form a second pattern 602 without developing the first pattern 302.

Figure 7:
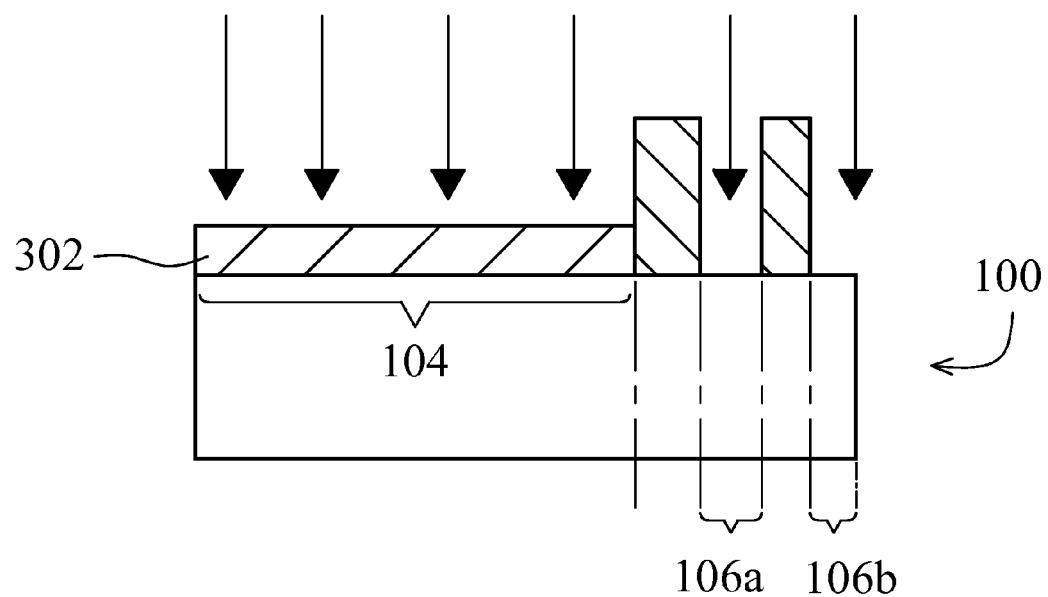
FIG. 7 is a sectional view illustrating the exemplar substrate in accordance with some embodiments.

FIG. 7 is a sectional view illustrating the exemplar substrate in accordance with some embodiments. As shown in FIG. 7, the first pattern 302 and the substrate 100 will be etched to form the substrate pattern (not shown) in the isolated region 104 and the dense regions 106a, 106b. The etching is performed by using a compound gas and the selectivity of etching rate between the first pattern 302 and the substrate 100 can be adjusted accordingly.

Figure 8:
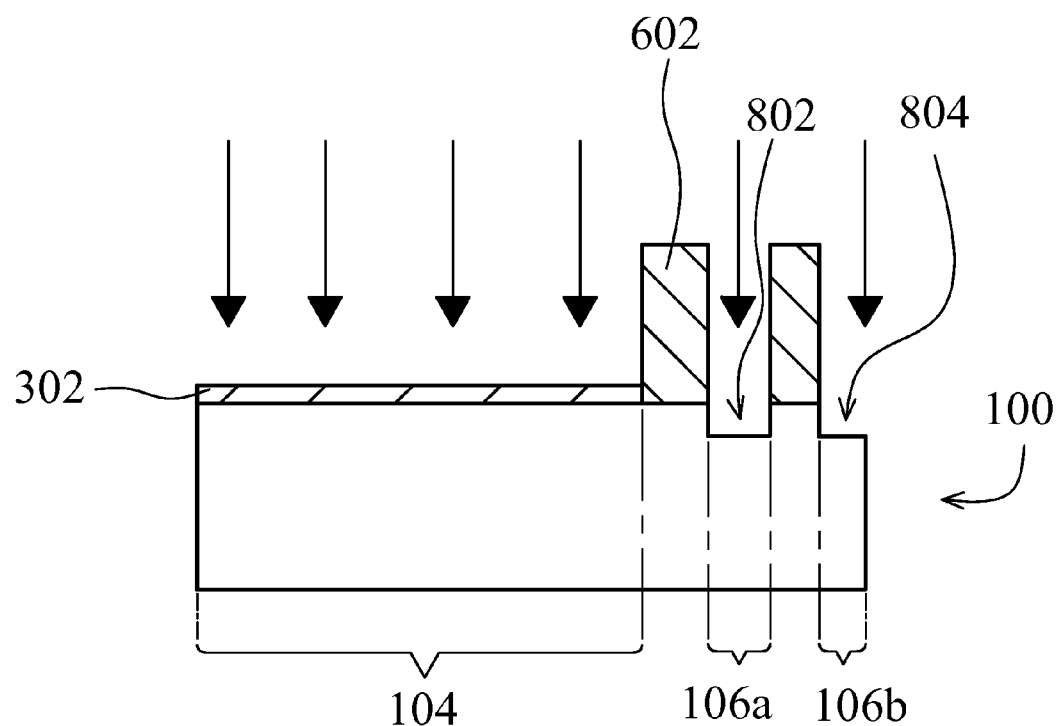
FIG. 8 is a sectional view illustrating the exemplar substrate in accordance with some embodiments.

FIG. 8 is a sectional view illustrating the exemplar substrate in accordance with some embodiments. As shown in FIG. 8, the first pattern 302 and the substrate 100 are etched so as to thinner the first pattern 302 in the isolated region 104 and to form trenches 802, 804 in the dense regions 106a, 106b. The first pattern 302 slows down etching rate of the substrate pattern (not shown) in the isolated region 104. The first pattern 302 and the substrate 100 are etched without etching the second pattern 602.

Figure 9:
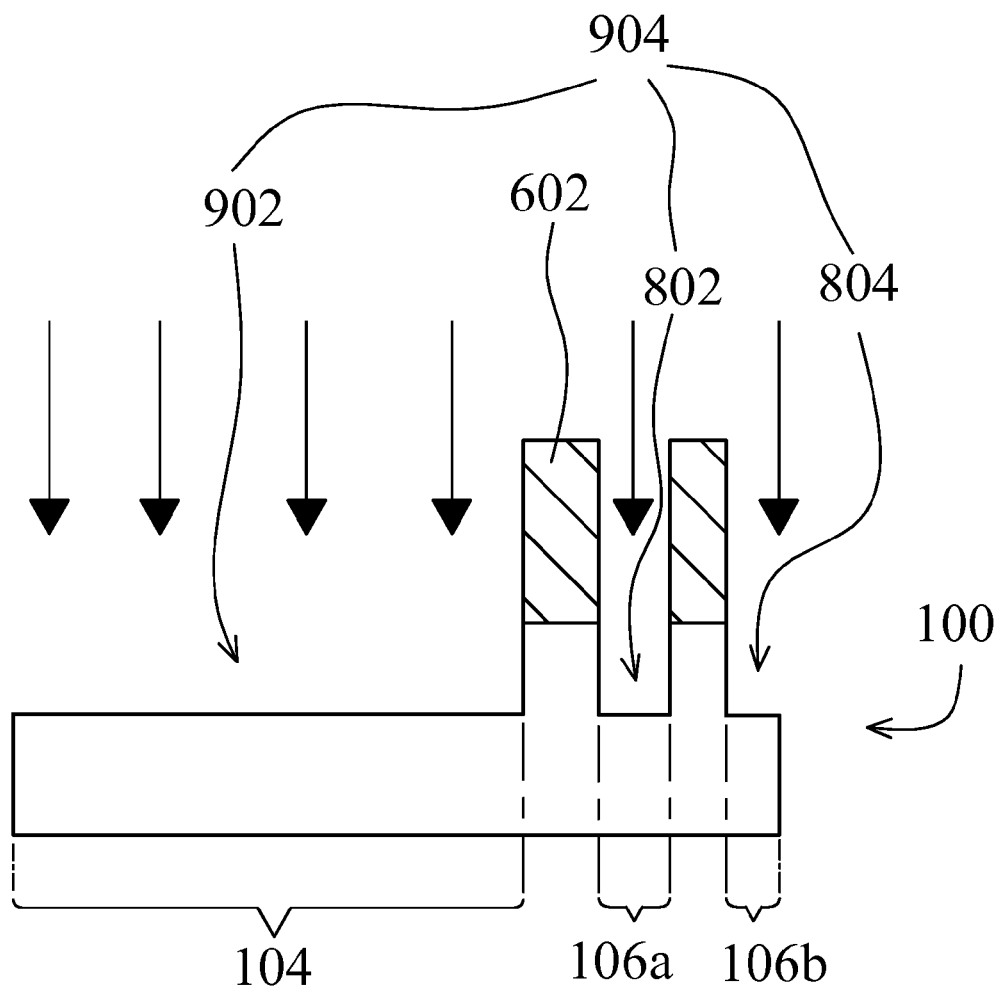
FIG. 9 is a sectional view illustrating the exemplar substrate in accordance with some embodiments.

FIG. 9 is a sectional view illustrating the exemplar substrate in accordance with some embodiments. As shown in FIG. 9, until the first pattern (not shown) in the isolation region 104 is substantially no longer present, the substrate 100 is etched so as to form a trench 902 and to deepen the trenches 802, 804. The substrate pattern 904, including the trench 902 in the isolated region 104 and the trenches 802, 804 in the dense regions 106a, 106b, is formed in the substrate 100. Bottom of the trench 902 in the isolated region 104 and bottom of the trenches 802, 804 in the dense regions 106a, 106b have substantially the same depth.

Figure 10:
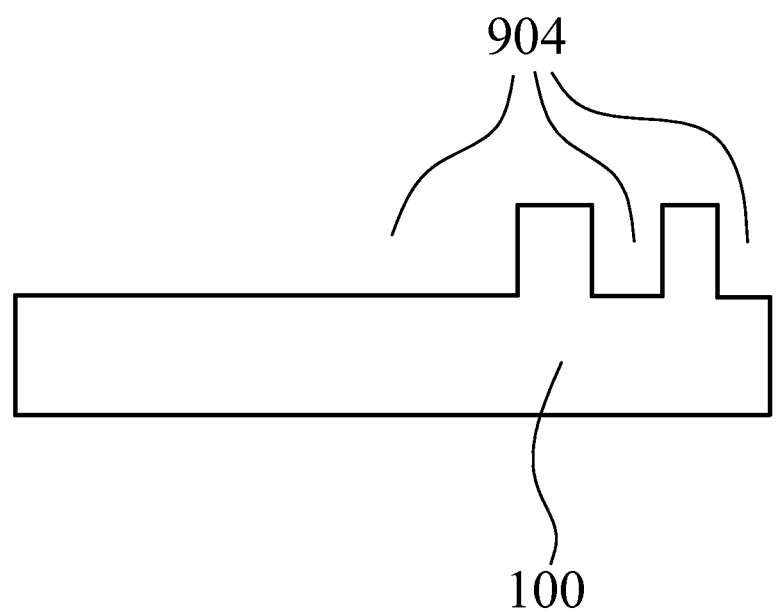
FIG. 10 is a sectional view illustrating the exemplar substrate in accordance with some embodiments.

FIG. 10 is a sectional view illustrating the exemplar substrate in accordance with some embodiments. As shown in FIG. 10, the second pattern (not shown) is removed substantially without etching the substrate 100. The substrate 100 with the substrate pattern 904 is formed.

Figure 11:
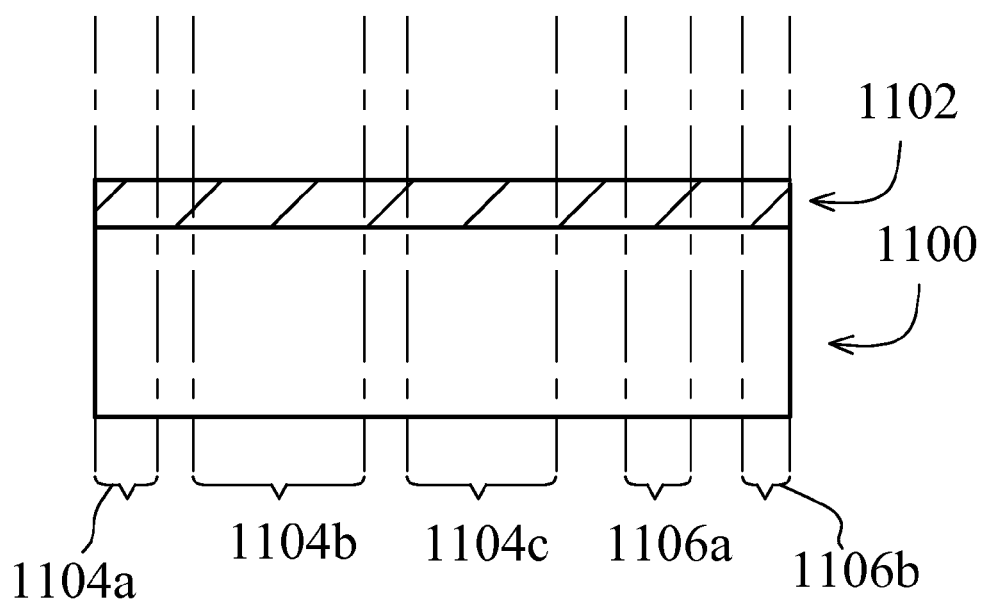
FIG. 11 is a sectional view illustrating an exemplar substrate in accordance with some embodiments.

FIG. 11 is a sectional view illustrating an exemplar substrate in accordance with some embodiments. As shown in FIG. 11, a substrate 1100 is provided. A first photoresist layer 1102 is formed over the substrate 1100. The substrate 1100 includes isolated regions 1104a, 1104b, 1104c and dense regions 1106a, 1106b. The first photoresist layer 1102 may be formed of a first negative photoresist. The isolated regions 1104a, 1104b, 1104c and the dense regions 1106a, 1106b are predetermined. Additionally, thickness and stiffness of the first photoresist layer 1102 may be adjusted to enhance the etching process.

Figure 12:
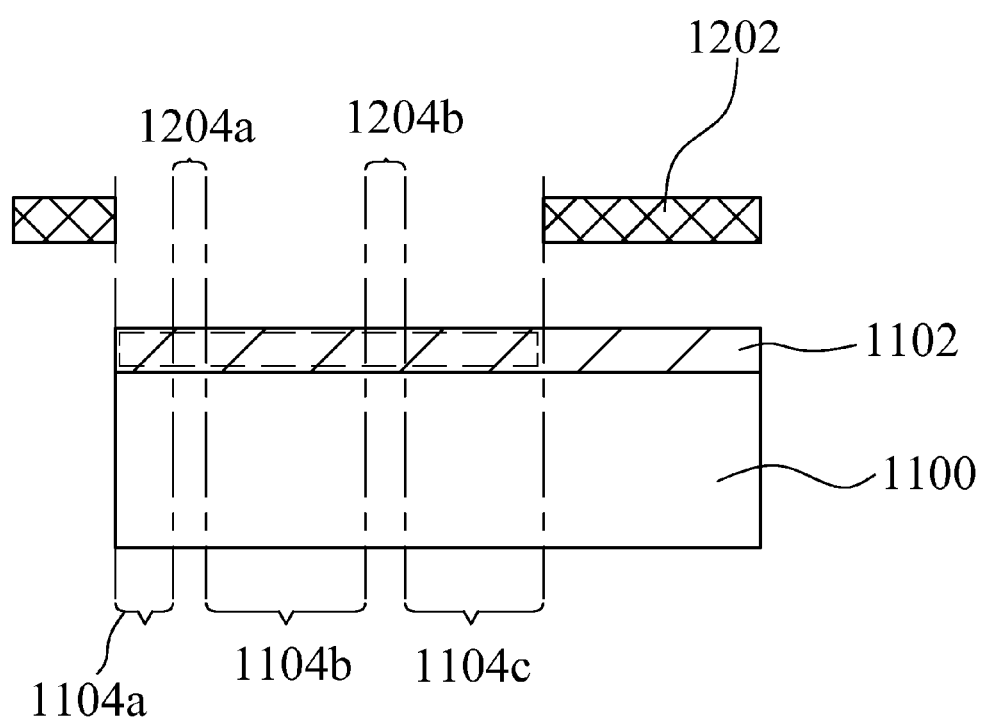
FIG. 12 is a sectional view illustrating the exemplar substrate in accordance with some embodiments.

FIG. 12 is a sectional view illustrating the exemplar substrate in accordance with some embodiments. As shown in FIG. 12, the first photoresist layer 1102 is exposed through a first mask 1202 corresponding to the isolated region 1104. In the embodiment, in addition to the isolated regions 1104a, 1104b, 1104c, the first mask 1202 is design to further expose the portions 1204a, 1204b of the first photoresist layer 1102 between the isolated regions 1104a, 1104b, 1104c.

Figure 13:
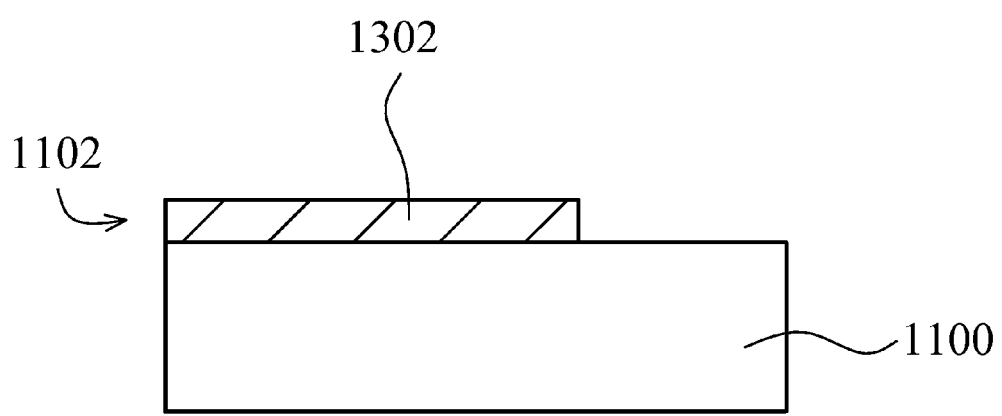
FIG. 13 is a sectional view illustrating the exemplar substrate in accordance with some embodiments.

FIG. 13 is a sectional view illustrating the exemplar substrate in accordance with some embodiments. As shown in FIG. 13, the first photoresist layer 1102 is developed to form a first pattern 1302.

Figure 14:
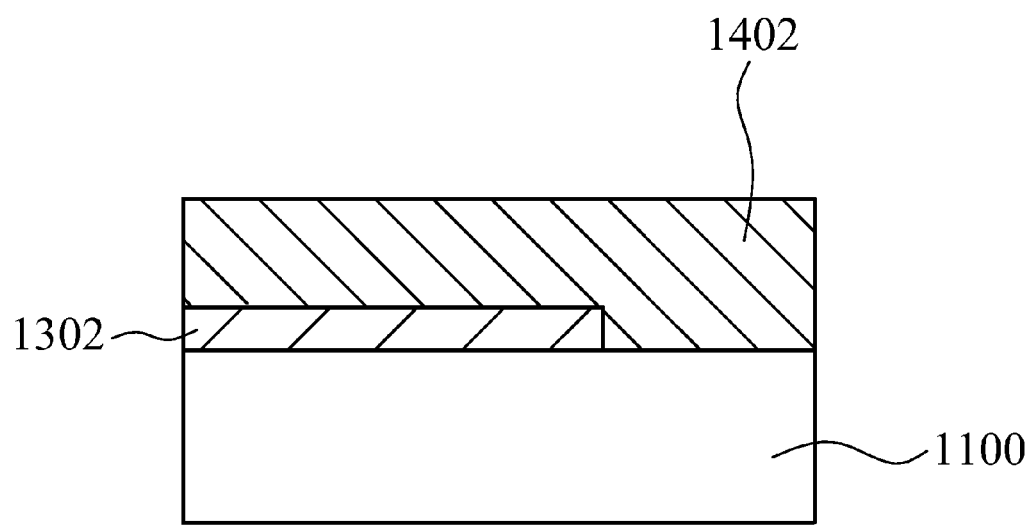
FIG. 14 is a sectional view illustrating the exemplar substrate in accordance with some embodiments.

FIG. 14 is a sectional view illustrating the exemplar substrate in accordance with some embodiments. As shown in FIG. 14, a second photoresist layer 1402 is formed over the substrate 1100 and the first pattern 1302. The second photoresist layer 1402 may be formed of a second negative photoresist.

Figure 15:
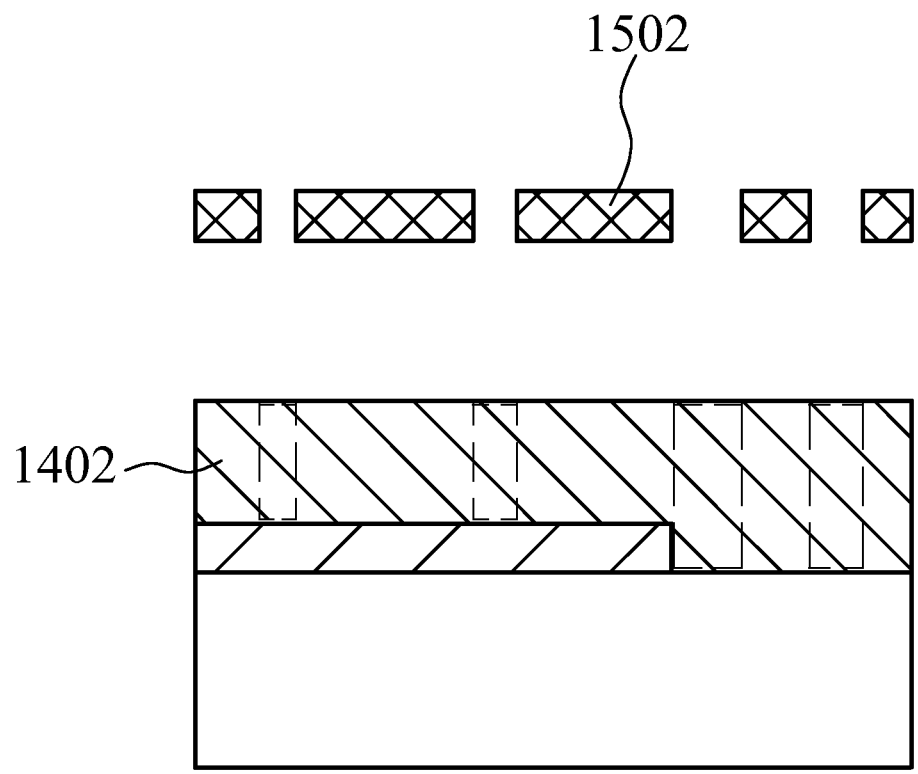
FIG. 15 is a sectional view illustrating the exemplar substrate in accordance with some embodiments.

FIG. 15 is a sectional view illustrating the exemplar substrate in accordance with some embodiments. As shown in FIG. 15, the second photoresist layer 1402 is exposed through a second mask 1502 corresponding to the substrate pattern (not shown).

Figure 16:
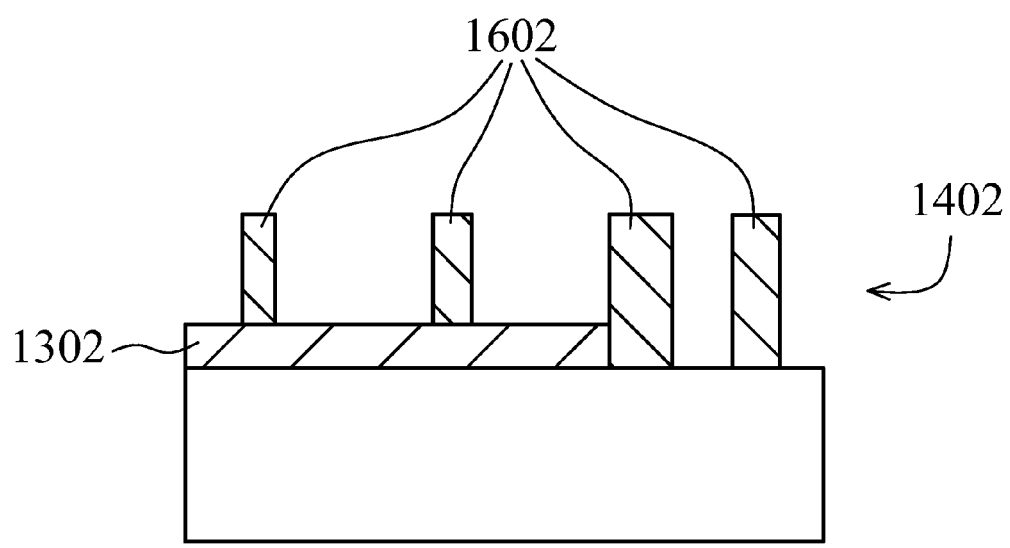
FIG. 16 is a sectional view illustrating the exemplar substrate in accordance with some embodiments.

FIG. 16 is a sectional view illustrating the exemplar substrate in accordance with some embodiments. As shown in FIG. 16, the second photoresist layer 1402 is developed to form a second pattern 1602 without developing the first pattern 1302. Additionally, a portion of the second pattern 1602 stands on the first pattern 1302.

Figure 17:
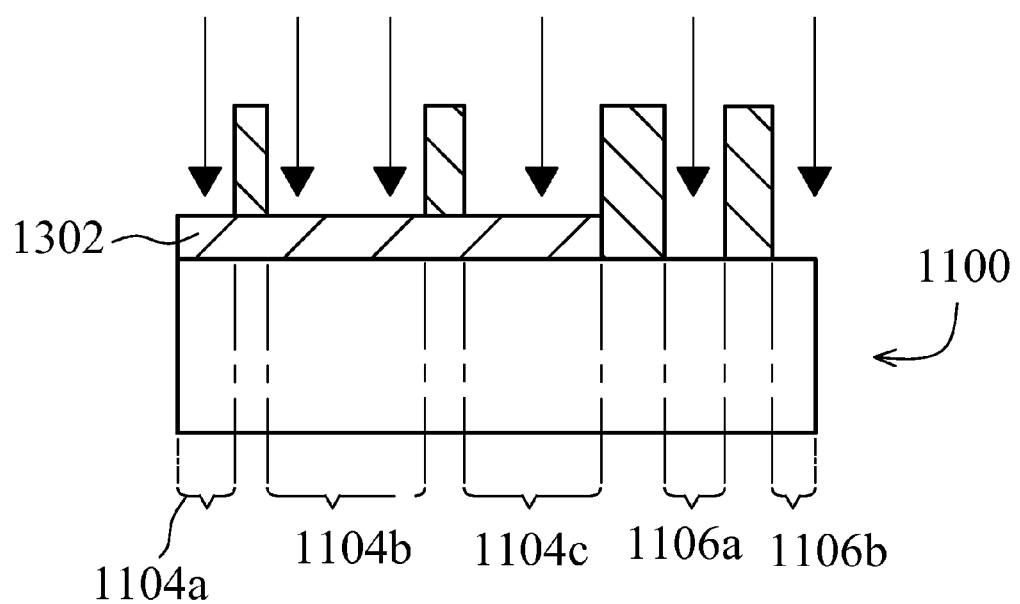
FIG. 17 is a sectional view illustrating the exemplar substrate in accordance with some embodiments.

FIG. 17 is a sectional view illustrating the exemplar substrate in accordance with some embodiments. As shown in FIG. 17, the first pattern 1302 and the substrate 1100 will be etched to form the substrate pattern (not shown) in the isolated regions 1104a, 1104b, 1104c and the dense regions 106a, 106b. The etching is performed by using a compound gas and the selectivity of etching rate between the first pattern 1302 and the substrate 1100 can be adjusted accordingly.

Figure 18:
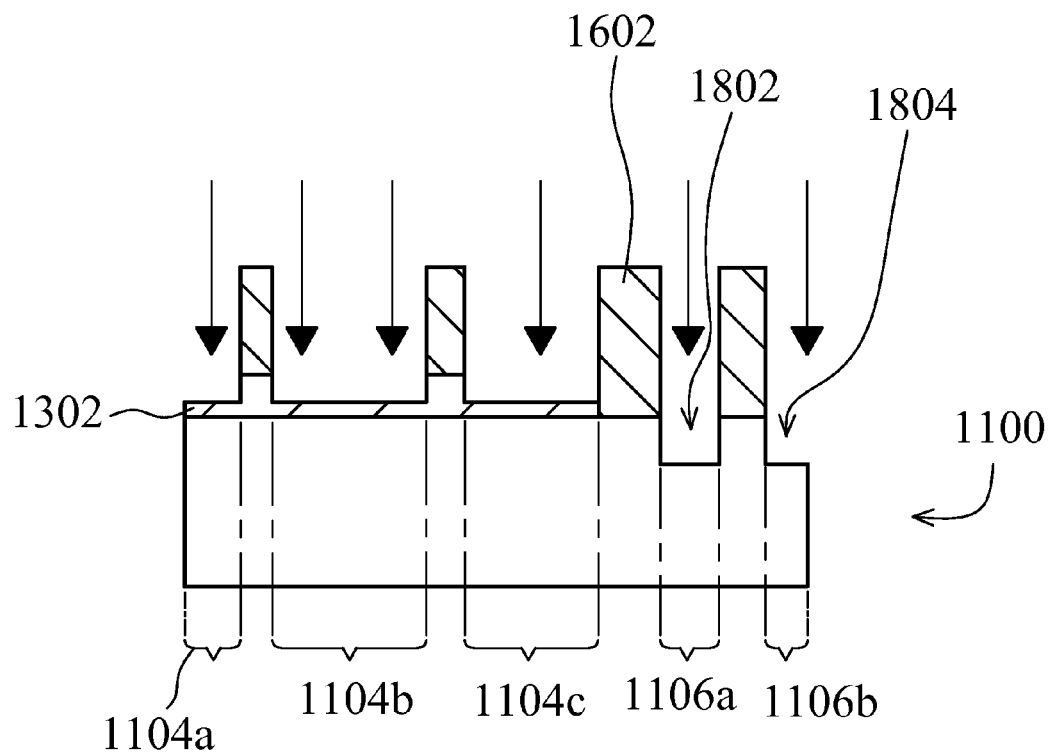
FIG. 18 is a sectional view illustrating the exemplar substrate in accordance with some embodiments.

FIG. 18 is a sectional view illustrating the exemplar substrate in accordance with some embodiments. As shown in FIG. 18, the first pattern 1302 and the substrate 1100 are etched so as to thin the first pattern 1302 in the isolated regions 1104a, 1104b, 1104c and to form trenches 1802, 1804 in the dense regions 1106a, 1106b. The first pattern 1302 slows down the etching rate of the substrate pattern (not shown) in the isolated region 1104a, 1104b, 1104c. The first pattern 1302 and the substrate 1100 are etched without etching the second pattern 1602.

Figure 19:
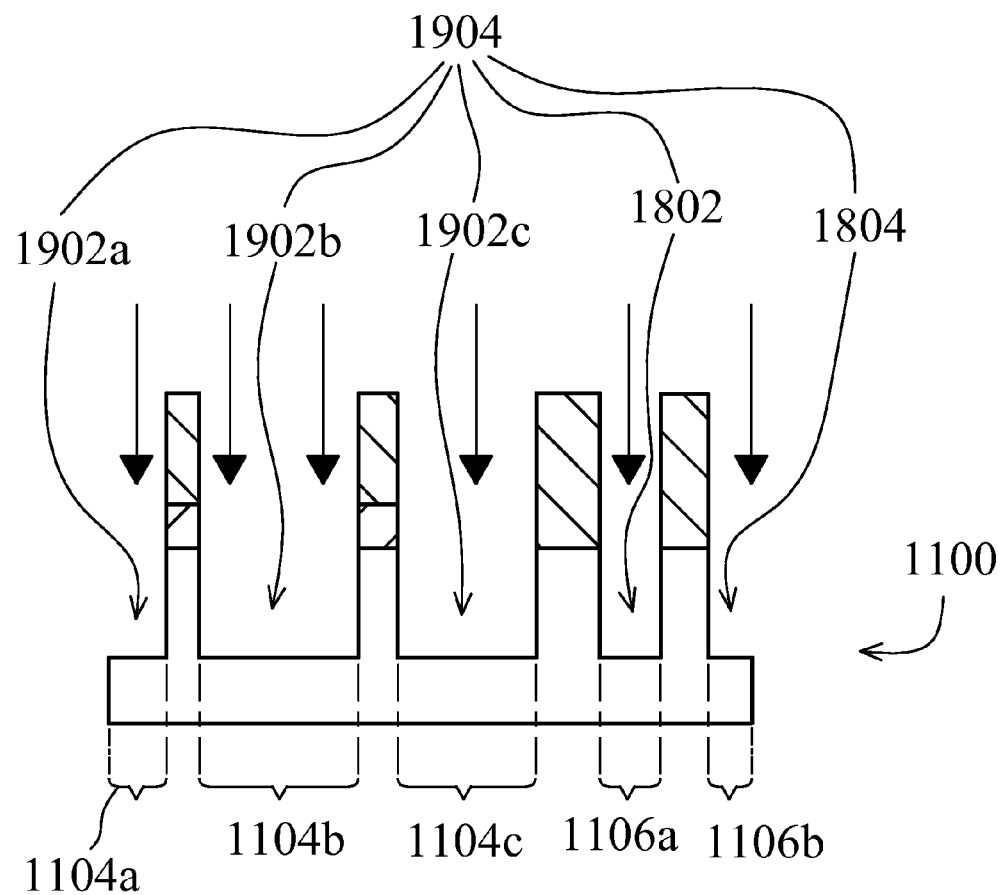
FIG. 19 is a sectional view illustrating the exemplar substrate in accordance with some embodiments.

FIG. 19 is a sectional view illustrating the exemplar substrate in accordance with some embodiments. As shown in FIG. 19, until the first pattern (not shown) in the isolated regions 1104a, 1104b, 1104c is substantially no longer present, the substrate 1100 is etched so as to form trenches 1902a, 1902b, 1902c and to deepen the trenches 1802, 1804. The substrate pattern 1904, including the trenches 1902a, 1902b, 1902c in the isolated regions 1104a, 1104b, 1104c and the trenches 1802, 1804 in the dense regions 1106a, 1106b, is formed in the substrate 1100. Bottom of the trenches 1902a, 1902b, 1902c in the isolated regions 1104a, 1104b, 1104c and bottom of the trenches 1802, 1804 in the dense regions 1106a, 1106b have substantially the same depth.

Figure 20:
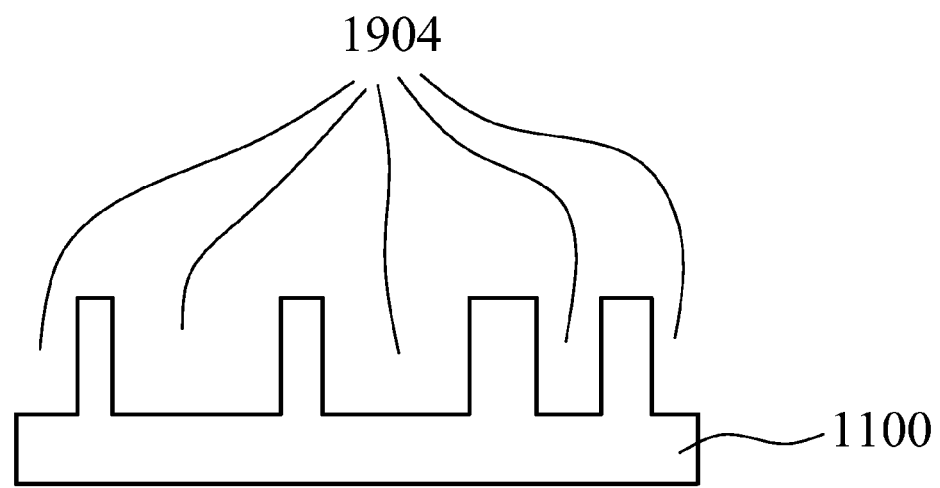
FIG. 20 is a sectional view illustrating the exemplar substrate in accordance with some embodiments.

FIG. 20 is a sectional view illustrating the exemplar substrate in accordance with some embodiments. As shown in FIG. 20, the second pattern (not shown) is removed substantially without etching the substrate 1100. The substrate 1100 with the substrate pattern 1904 is formed.

Figure 21A:
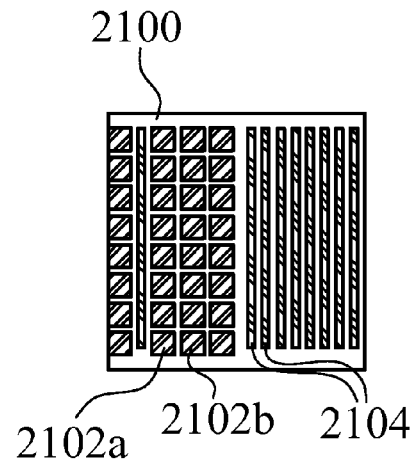
FIG. 21(a)-21(c) are top views illustrating the exemplar substrate during the etching process in accordance with some embodiments.
Figure 21B:
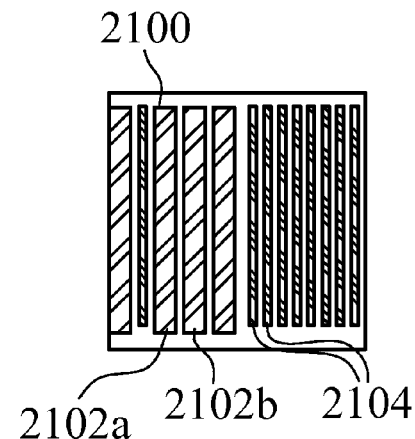
Figure 21C:
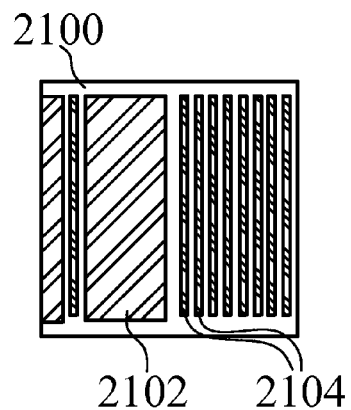

FIG. 21(a)-21(c) are top views illustrating the exemplar substrate during the etching process in accordance with some embodiments. First patterns 2102a, 2102b and second patterns 2104 are formed over the substrate 2100. The first patterns 2102a, 2102b for slowing down etching rate of the substrate pattern in the isolated region can be squares in FIG. 21(a), lines in FIG. 21(b) or a bulk in FIG. 21(c). Any distance between the first patterns 2102a, 2102b and the second patterns 2104 is possible. The first patterns 2102a, 2102b are used to compensate the pattern density, and for this purpose there is no need to constrain thickness of the first patterns 2102a, 2102b to a specific value. For example, the first patterns 2102a, 2102b can be formed of different photoresist with different thickness or materials.

The first patterns 2102a, 2102b and the second patterns 2104 can be formed via any photolithography (including i-ilne, DUV, EUV or using other wavelengths), e-beam, plasma, or any kinds of cross-linked or cross-linked free methods. The developers of the first patterns 2102a, 2102b and the second patterns 2104 are not necessary the same.

Figure 22:
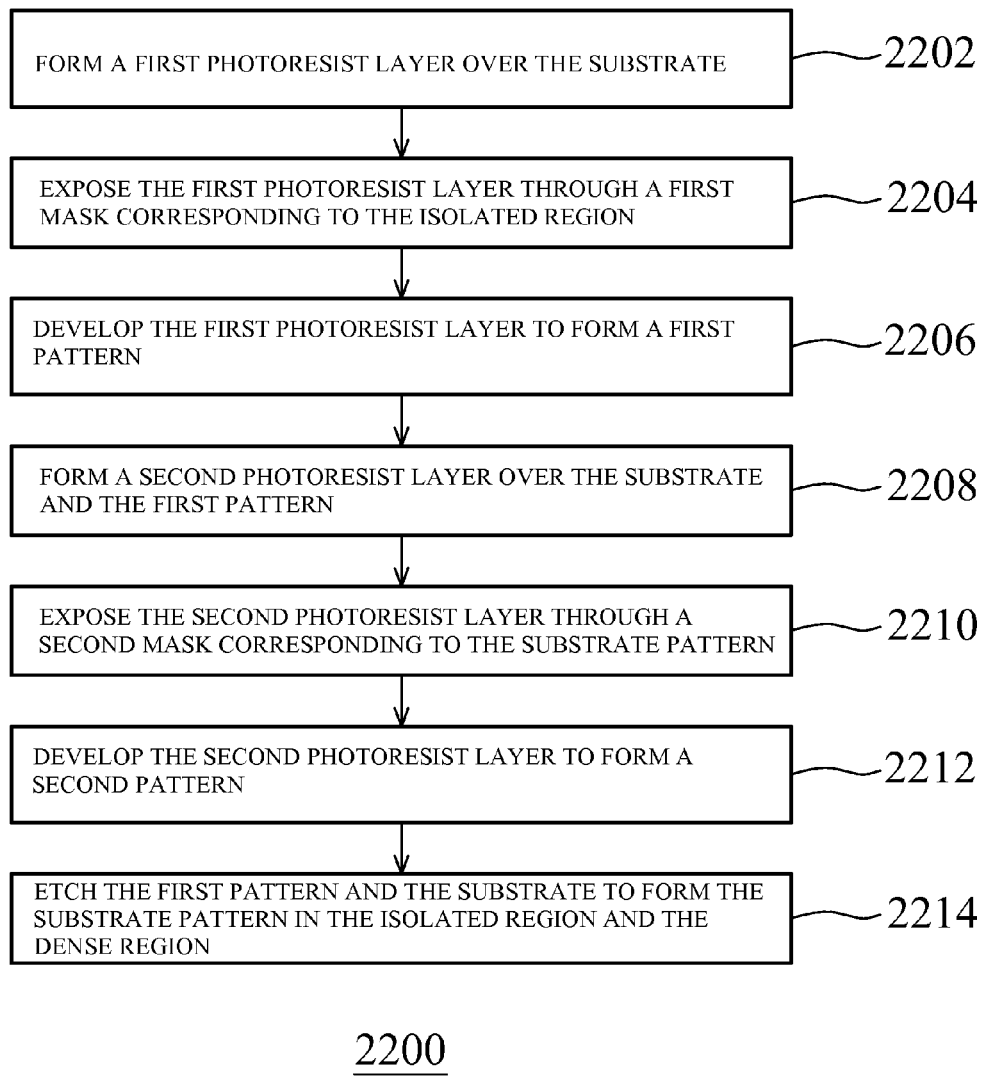
FIG. 22 is a flow chart for a method of forming a substrate pattern in accordance with some embodiments.

FIG. 22 is a flow chart for a method of forming a substrate pattern having an isolated region and a dense region in accordance with some embodiments. As shown in FIG. 22, a method 2200 is provided. The method 2200 includes the following operations: forming a first photoresist layer over the substrate (2202); exposing the first photoresist layer through a first mask corresponding to the isolated region (2204); developing the first photoresist layer to form a first pattern (2206); forming a second photoresist layer over the substrate and the first pattern (2208); exposing the second photoresist layer through a second mask corresponding to the substrate pattern (2210); developing the second photoresist layer to form a second pattern (2212); and etching the first pattern and the substrate to form the substrate pattern in the isolated region and the dense region (2214).

In the embodiment, the method 2200 may further include: removing the second pattern without etching the substrate. The operation 2214 of etching the first pattern and the substrate to form the substrate pattern in the isolated region and the dense region further comprises: etching the first pattern and the substrate without etching the second pattern. The operation 2214 of etching the first pattern and the substrate to form the substrate pattern in the isolated region and the dense region further comprises: using the first pattern to slow down etching rate of the substrate pattern in the isolated region. The operation 2214 of etching the first pattern and the substrate to form the substrate pattern in the isolated region and the dense region further comprises: etching the first pattern and the substrate by using a compound gas. The operation 2214 of etching the first pattern and the substrate to form the substrate pattern in the isolated region and the dense region further comprises: etching the first pattern and the substrate substantially until the first pattern in the isolated region is substantially no longer present. The operation 2214 of etching the first pattern and the substrate to form the substrate pattern in the isolated region and the dense region further comprises: etching the substrate until bottom of the substrate pattern in the isolated region and bottom of the substrate pattern in the dense region have a same depth.

The operation 2212 of developing the second photoresist layer to form the second pattern further comprises: developing the second photoresist layer substantially without developing the first pattern. The operation 2202 of forming the first photoresist layer over the substrate further comprises: forming the first photoresist layer over the substrate by using a first negative photoresist. The operation 2208 of forming the second photoresist layer over the substrate and the first pattern further comprises: forming the second photoresist layer over the substrate and the first pattern by using a second negative photoresist. The operation 2202 of forming the first photoresist layer over the substrate further comprises: adjusting thickness and stiffness of the first photoresist layer.

Figure 23:
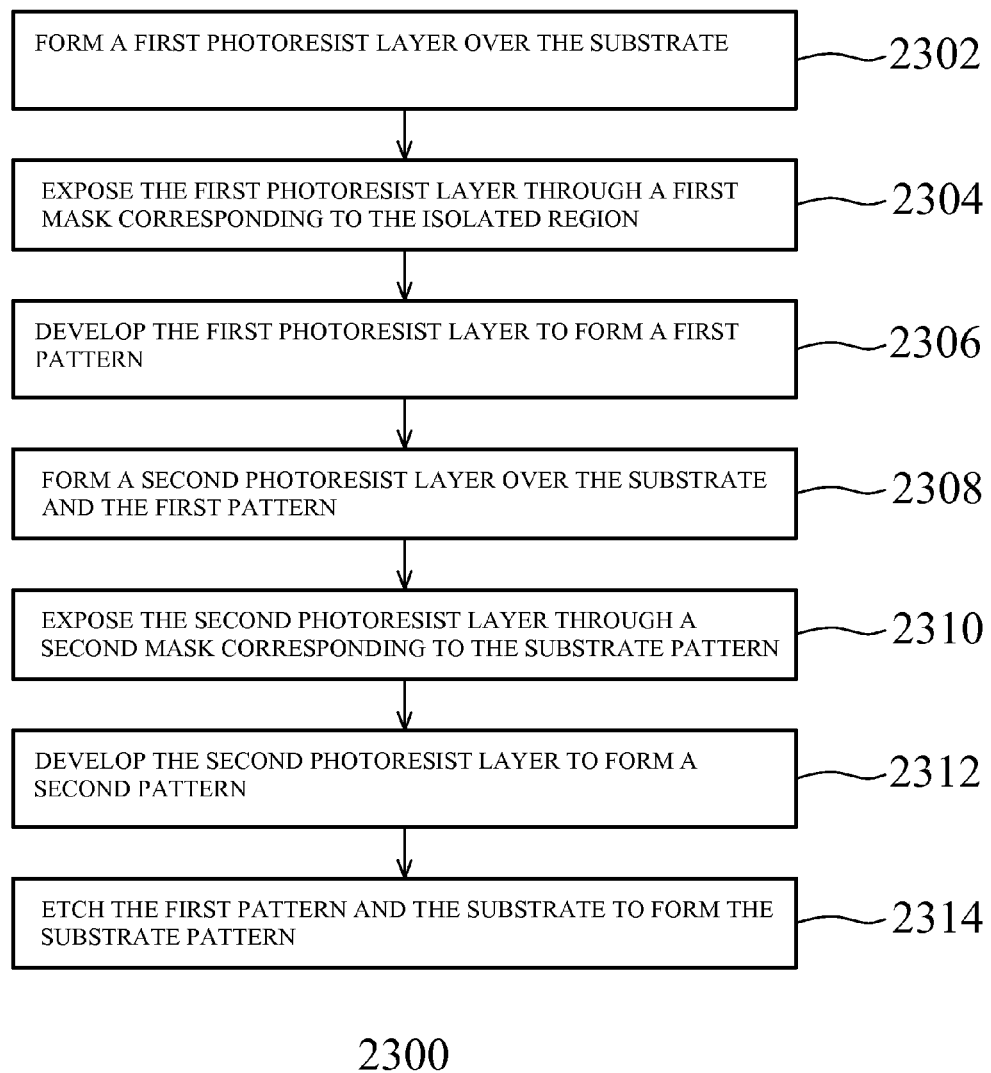
FIG. 23 is a flow chart for a method of forming a substrate pattern in accordance with some embodiments.

FIG. 23 is a flow chart for a method of forming a substrate pattern having an isolated region in accordance with some embodiments. As shown in FIG. 23, a method 2300 is provided. The method 2300 includes the following operations: forming a first photoresist layer over the substrate (2302); exposing the first photoresist layer through a first mask corresponding to the isolated region (2304); developing the first photoresist layer to form a first pattern (2306); forming a second photoresist layer over the substrate and the first pattern (2308); exposing the second photoresist layer through a second mask corresponding to the substrate pattern (2310); developing the second photoresist layer to form a second pattern (2312); and etching the first pattern and the substrate to form the substrate pattern (2314).

In the embodiment, the method 2300 may further include: removing the second pattern. The operation 2314 of etching the first pattern and the substrate to form the substrate pattern further includes: etching the first pattern and the substrate without etching the second pattern. The operation 2314 of etching the first pattern and the substrate to form the substrate pattern further includes: using the first pattern to slow down etching rate the substrate pattern in the isolated region. The operation 2314 of etching the first pattern and the substrate to form the substrate pattern further includes: etching the first pattern and the substrate by using a compound gas. The operation 2314 of etching the first pattern and the substrate to form the substrate pattern further includes: etching the first pattern and the substrate substantially until the first pattern in the isolated region is substantially no longer present. The operation 2314 of etching the first pattern and the substrate to form the substrate pattern further includes: etching the substrate until bottom of the substrate pattern has a same depth.

Figure 24:
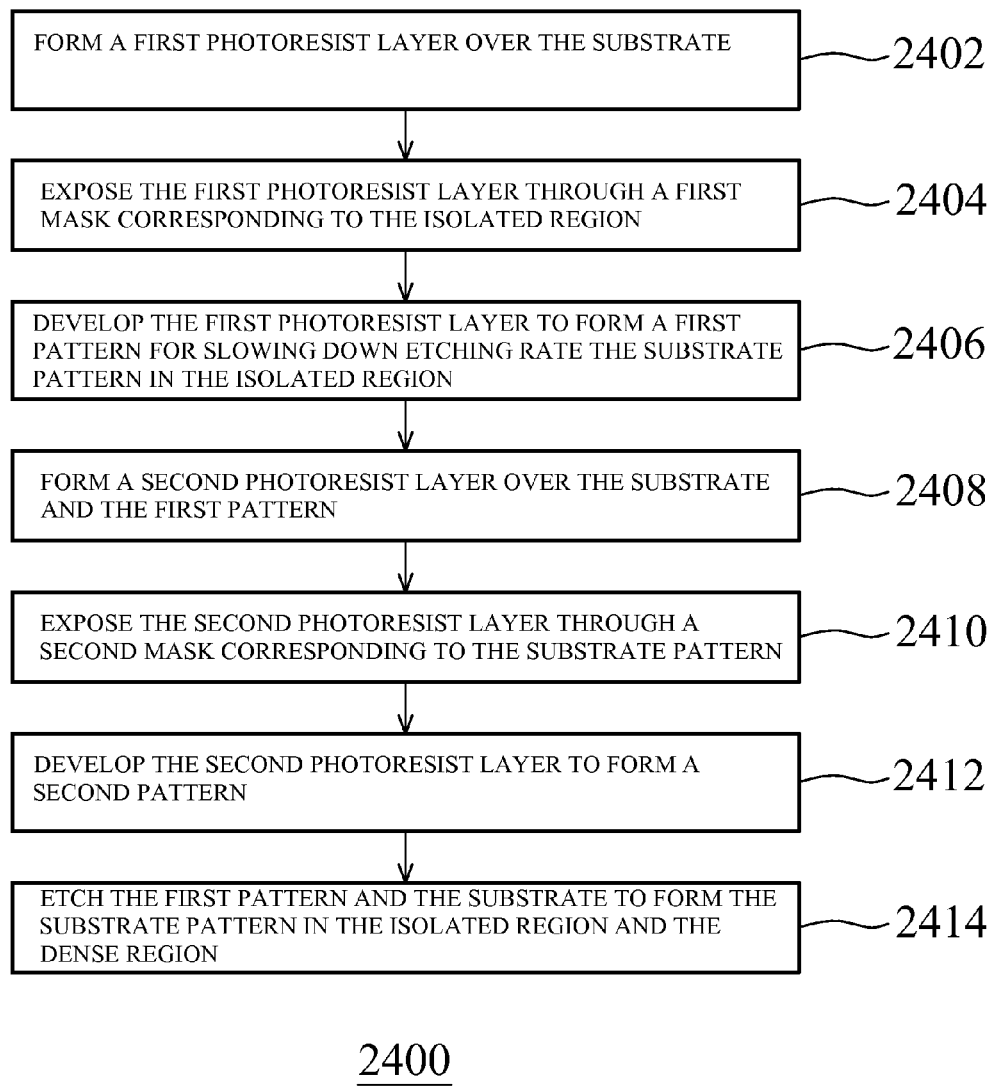
FIG. 24 is a flow chart for a method of forming a substrate pattern in accordance with some embodiments.

FIG. 24 is a flow chart for a method of forming a substrate pattern having an isolated region and a dense region in accordance with some embodiments. As shown in FIG. 24, a method 2400 is provided. The method 2400 includes the following operations: forming a first photoresist layer over the substrate (2402); exposing the first photoresist layer through a first mask corresponding to the isolated region (2404); developing the first photoresist layer to form a first pattern for slowing down etching rate the substrate pattern in the isolated region (2406); forming a second photoresist layer over the substrate and the first pattern (2408); exposing the second photoresist layer through a second mask corresponding to the substrate pattern (2410); developing the second photoresist layer to form a second pattern (2412); and etching the first pattern and the substrate to form the substrate pattern in the isolated region and the dense region (2414).

According to an exemplary embodiment, a method of forming a substrate pattern having an isolated region and a dense region is provided. The method includes the following operations: forming a first photoresist layer over the substrate; exposing the first photoresist layer through a first mask corresponding to the isolated region; developing the first photoresist layer to form a first pattern; forming a second photoresist layer over the substrate and the first pattern; exposing the second photoresist layer through a second mask corresponding to the substrate pattern; developing the second photoresist layer to form a second pattern; and etching the first pattern and the substrate to form the substrate pattern in the isolated region and the dense region.

According to an exemplary embodiment, a method of forming a substrate pattern having an isolated region is provided. The method includes the following operations: forming a first photoresist layer over the substrate; exposing the first photoresist layer through a first mask corresponding to the isolated region; developing the first photoresist layer to form a first pattern; forming a second photoresist layer over the substrate and the first pattern; exposing the second photoresist layer through a second mask corresponding to the substrate pattern; developing the second photoresist layer to form a second pattern; and etching the first pattern and the substrate to form the substrate pattern.

According to an exemplary embodiment, a method of forming a substrate pattern having an isolated region and a dense region is provided. The method includes the following operations: forming a first photoresist layer over the substrate; exposing the first photoresist layer through a first mask corresponding to the isolated region; developing the first photoresist layer to form a first pattern for slowing down etching rate the substrate pattern in the isolated region; forming a second photoresist layer over the substrate and the first pattern; exposing the second photoresist layer through a second mask corresponding to the substrate pattern; developing the second photoresist layer to form a second pattern; and etching the first pattern and the substrate to form the substrate pattern in the isolated region and the dense region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a substrate pattern having an isolated region and a dense region, comprising:
    forming a first photoresist layer over the substrate;
    exposing the first photoresist layer through a first mask corresponding to the isolated region;
    developing the first photoresist layer to form a first pattern;
    forming a second photoresist layer over the substrate and the first pattern;
    exposing the second photoresist layer through a second mask corresponding to the substrate pattern;
    developing the second photoresist layer to form a second pattern; and
    etching the first pattern and the substrate to form the substrate pattern in the isolated region and the dense region.

2. The method of claim 1, wherein etching the first pattern and the substrate to form the substrate pattern in the isolated region and the dense region further comprises: etching the first pattern and the substrate without etching the second pattern.

3. The method of claim 1, wherein etching the first pattern and the substrate to form the substrate pattern in the isolated region and the dense region further comprises: using the first pattern to slow down etching rate of the substrate pattern in the isolated region.

4. The method of claim 1, wherein etching the first pattern and the substrate to form the substrate pattern in the isolated region and the dense region further comprises: etching the first pattern and the substrate by using a compound gas.

5. The method of claim 1, wherein etching the first pattern and the substrate to form the substrate pattern in the isolated region and the dense region further comprises: etching the first pattern and the substrate substantially until the first pattern in the isolated region is substantially no longer present.

6. The method of claim 1, wherein etching the first pattern and the substrate to form the substrate pattern in the isolated region and the dense region further comprises: etching the substrate until bottom of the substrate pattern in the isolated region and bottom of the substrate pattern in the dense region have substantially a same depth.

7. The method of claim 1, wherein developing the second photoresist layer to form the second pattern further comprises: developing the second photoresist layer substantially without developing the first pattern.

8. The method of claim 1, wherein forming the first photoresist layer over the substrate further comprises: forming the first photoresist layer over the substrate by using a first negative photoresist.

9. The method of claim 1, wherein forming the second photoresist layer over the substrate and the first pattern further comprises: forming the second photoresist layer over the substrate and the first pattern by using a second negative photoresist.

10. The method of claim 1, wherein forming the first photoresist layer over the substrate further comprises: adjusting thickness and stiffness of the first photoresist layer.

11. The method of claim 1, further comprising: removing the second pattern.

12. The method of claim 11, wherein removing the second pattern further comprises: removing the second pattern substantially without etching the substrate.

13. A method of forming a substrate pattern having an isolated region, comprising:
    forming a first photoresist layer over the substrate;
    exposing the first photoresist layer through a first mask corresponding to the isolated region;
    developing the first photoresist layer to form a first pattern;
    forming a second photoresist layer over the substrate and the first pattern;
    exposing the second photoresist layer through a second mask corresponding to the substrate pattern;
    developing the second photoresist layer to form a second pattern; and
    etching the first pattern and the substrate to form the substrate pattern.

14. The method of claim 13, further comprising: removing the second pattern.

15. The method of claim 13, wherein etching the first pattern and the substrate to form the substrate pattern further comprises: etching the first pattern and the substrate without etching the second pattern.

16. The method of claim 13, wherein etching the first pattern and the substrate to form the substrate pattern further comprises: using the first pattern to slow down etching rate the substrate pattern in the isolated region.

17. The method of claim 13, wherein etching the first pattern and the substrate to form the substrate pattern further comprises: etching the first pattern and the substrate by using a compound gas.

18. The method of claim 13, wherein etching the first pattern and the substrate to form the substrate pattern further comprises: etching the first pattern and the substrate substantially until the first pattern in the isolated region is substantially no longer present.

19. The method of claim 13, wherein etching the first pattern and the substrate to form the substrate pattern further comprises: etching the substrate until bottom of the substrate pattern has a substantially same depth.

20. A method of forming a substrate pattern having an isolated region and a dense region, comprising:
    forming a first photoresist layer over the substrate;
    exposing the first photoresist layer through a first mask corresponding to the isolated region;

developing the first photoresist layer to form a first pattern for slowing down etching rate the substrate pattern in the isolated region;

forming a second photoresist layer over the substrate and the first pattern;

exposing the second photoresist layer through a second mask corresponding to the substrate pattern;

developing the second photoresist layer to form a second pattern; and etching the first pattern and the substrate to form the substrate pattern in the isolated region and the dense region.

\* \* \* \* \*